(12) United States Patent
Tsai et al.

(10) Patent No.: US 12,238,912 B2
(45) Date of Patent: Feb. 25, 2025

(54) ELECTROMAGNETIC ENERGY MITIGATION ASSEMBLIES AND AUTOMOTIVE VEHICLE COMPONENTS INCLUDING THE SAME

(71) Applicant: Laird Technologies (Shenzhen) Co. Ltd., Shenzhen (CN)

(72) Inventors: Tsang-I Tsai, Xinbei (TW); Yunxi She, Shenzhen (CN); Dong-Xiang Li, Shenzhen (CN); Jie-Sheng Chen, Shenzhen (CN); Min-Wei Hsu, New Taipei (TW)

(73) Assignee: Laird Technologies (Shenzhen) Ltd., Shenzhen (CN)

( * ) Notice: Subject to any disclaimer, the term of this patent is extended or adjusted under 35 U.S.C. 154(b) by 5 days.

(21) Appl. No.: 18/240,997

(22) Filed: Aug. 31, 2023

(65) Prior Publication Data

US 2024/0098953 A1 Mar. 21, 2024

(30) Foreign Application Priority Data

Sep. 21, 2022 (CN) .......................... 202222506579.1

(51) Int. Cl.
  *H05K 9/00* (2006.01)
  *B60L 50/64* (2019.01)

(52) U.S. Cl.
  CPC ............ *H05K 9/0088* (2013.01); *B60L 50/64* (2019.02)

(58) Field of Classification Search
  CPC .................................................. H05K 9/0088
  See application file for complete search history.

(56) References Cited

U.S. PATENT DOCUMENTS

| 2016/0007510 A1* | 1/2016 | Cheng .................. H05K 9/0088 |
| | | 428/335 |
| 2022/0142022 A1 | 5/2022 | Su et al. |

FOREIGN PATENT DOCUMENTS

| CN | 209824317 U | 12/2019 |
| CN | 210491555 U | 5/2020 |
| CN | 114919265 A | 8/2022 |

OTHER PUBLICATIONS

NoiseSorb NS1000 Series; www.lairdtech.com; accessed Aug. 23, 2022; 2 pages.

(Continued)

*Primary Examiner* — Hung V Ngo
(74) *Attorney, Agent, or Firm* — Harness, Dickey & Pierce, P.L.C.; Anthony G. Fussner

(57) ABSTRACT

This application discloses electromagnetic energy mitigation assemblies and automotive vehicle components comprising the electromagnetic energy mitigation assemblies. An electromagnetic energy mitigation assembly includes a first electrically conductive layer and a second electrically conductive layer. First and second permalloy layers are along respective first and second opposite sides of the first electrically conductive layer. Third and fourth permalloy layers are along respective third and fourth opposite sides of the second electrically conductive layer. An electromagnetic noise suppression layer is sandwiched between the second and third permalloy layers. An automotive vehicle component includes an electromagnetic energy mitigation assembly configured to be positioned relative to one or more batteries of an automotive vehicle for providing electromagnetic shielding for the one or more batteries. The electromagnetic energy mitigation assembly includes a first electrically conductive layer. First and second permalloy layers are along respective first and second opposite sides of the first electrically conductive layer.

23 Claims, 4 Drawing Sheets

(56) References Cited

OTHER PUBLICATIONS

European Search Report for EP23195103.9 that claims priority to the same parent application as the instant application; dated Feb. 19, 2024; 8 pages.

* cited by examiner

ELECTROMAGNETIC ENERGY MITIGATION ASSEMBLIES AND AUTOMOTIVE VEHICLE COMPONENTS INCLUDING THE SAME

CROSS REFERENCE TO RELATED APPLICATION

This application claims priority to and the benefit of Chinese Utility Model Application No. 202222506579.1 filed Sep. 21, 2022 (granted on Feb. 28, 2023 as Chinese Utility Model Patent No. ZL 202222506579.1), which is incorporated herein by reference in its entirety.

TECHNICAL FIELD

The present application generally relates to the technical field of electromagnetic shielding, and in particular to electromagnetic energy mitigation assemblies and automotive vehicle components including the same.

BACKGROUND

This section provides background information related to the present disclosure which is not necessarily prior art.

To shield interference from an external electromagnetic wave, it is common practice to attach an electromagnetic shielding film on electronic equipment. But as recognized herein, it tends to be difficult for conventional electromagnetic shielding films to achieve good shielding effectiveness for electromagnetic waves of extremely low frequency (e.g., less than 100 kilohertz (kHZ), etc.).

SUMMARY

This section provides a general summary of the disclosure and is not a comprehensive disclosure of its full scope or all of its features.

Exemplary embodiments are disclosed of electromagnetic energy mitigation assemblies. In an exemplary embodiment, an electromagnetic energy mitigation assembly includes a first electrically conductive layer and a second electrically conductive layer. First and second permalloy layers are along respective first and second opposite sides of the first electrically conductive layer. Third and fourth permalloy layers are along respective third and fourth opposite sides of the second electrically conductive layer. An electromagnetic noise suppression layer is sandwiched between the second and third permalloy layers.

Also disclosed are exemplary embodiments of automotive vehicle components including electromagnetic energy mitigation assemblies. In an exemplary embodiment, an automotive vehicle component includes an electromagnetic energy mitigation assembly configured to be positioned relative to one or more batteries of an automotive vehicle for providing electromagnetic shielding for the one or more batteries. The electromagnetic energy mitigation assembly includes a first electrically conductive layer. First and second permalloy layers are along respective first and second opposite sides of the first electrically conductive layer.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 1:
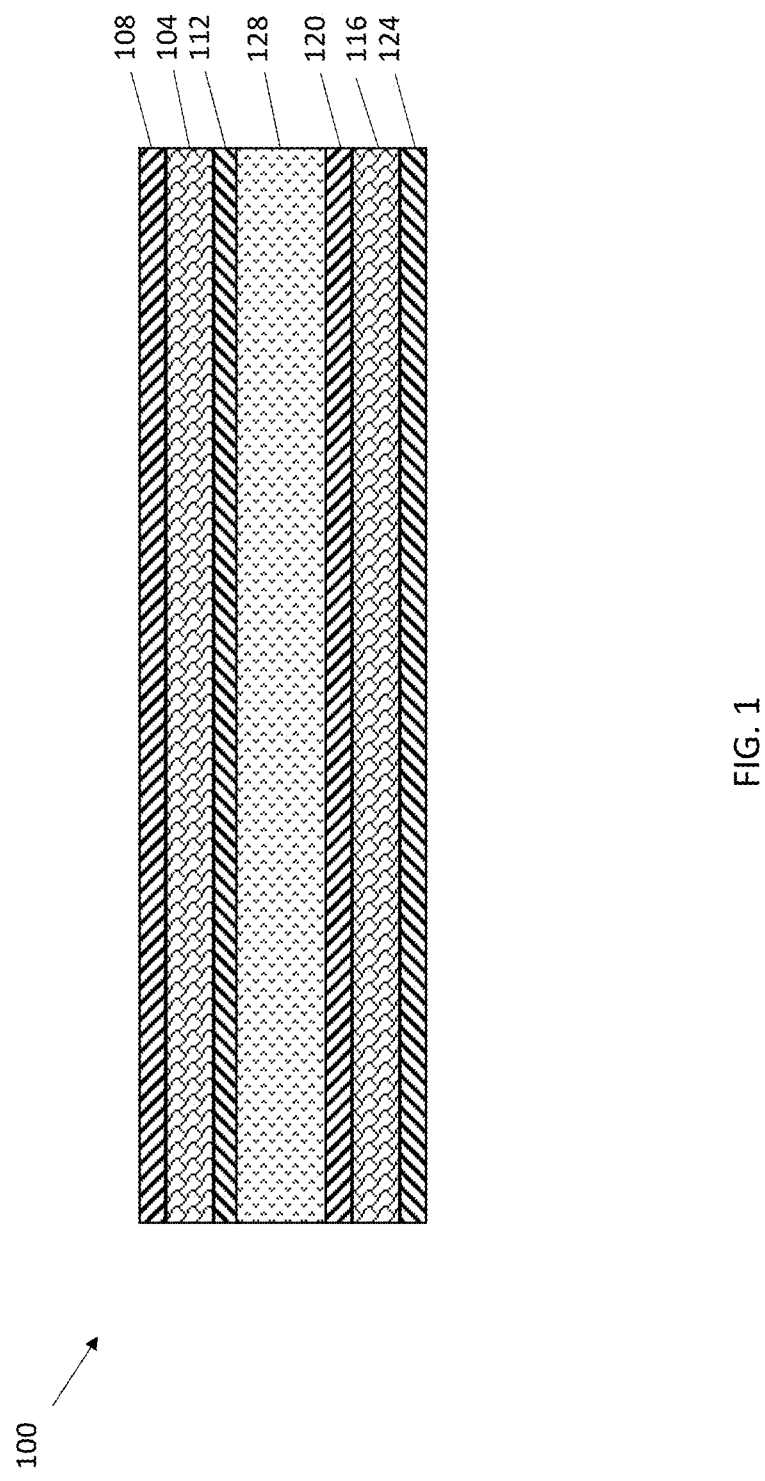
FIG. 1 is a cross-sectional view of an electromagnetic energy mitigation assembly according to an exemplary embodiment.
Figure 3:
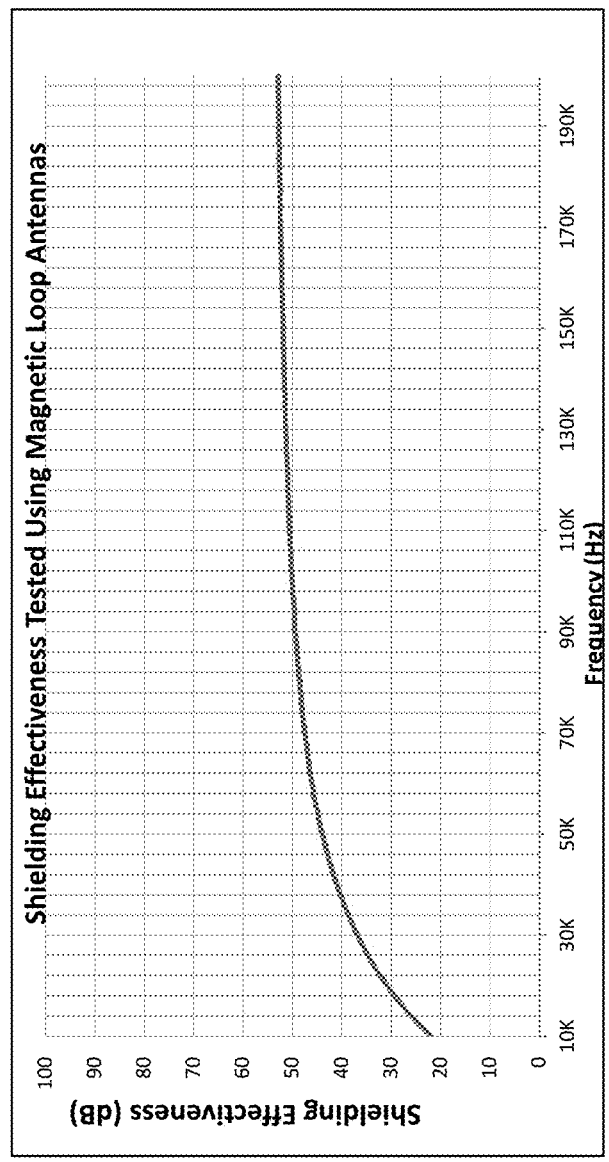

FIG. 3 includes a line graph of shielding effectiveness in decibels (dB) versus frequency in hertz (Hz) for a prototype of an electromagnetic energy mitigation assembly according to the exemplary embodiment shown in FIG. 1 where the shielding effectiveness testing included using magnetic loop antennas.

Figure 4:
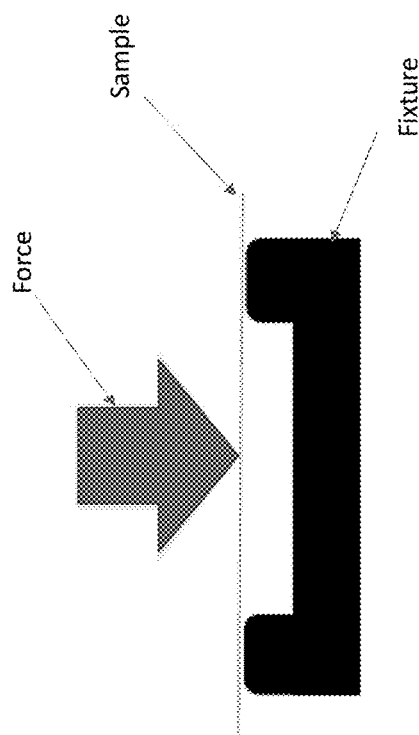
Figure 4:
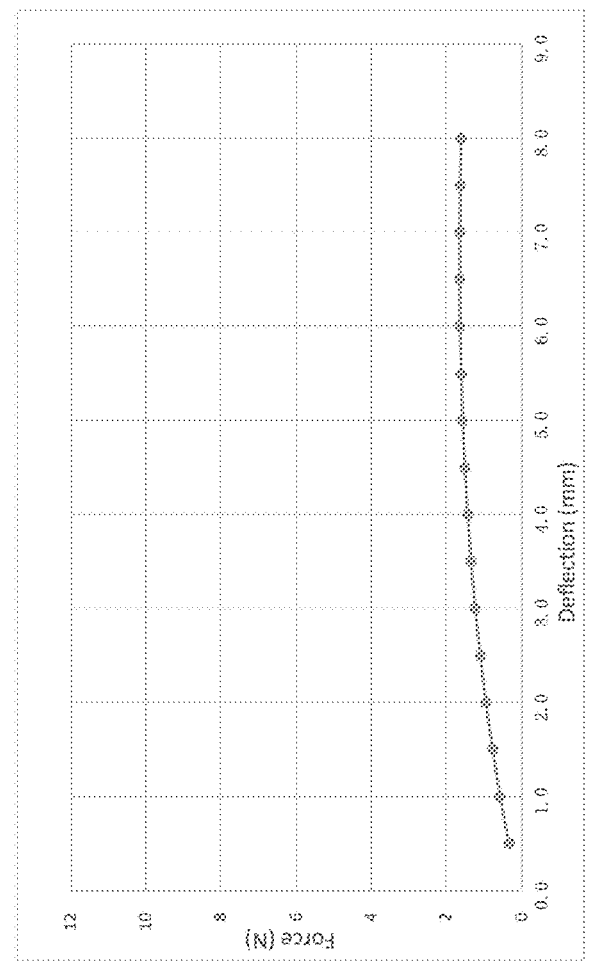

FIG. 4 includes a line graph of force in Newtons (N) versus deflection in millimeters (mm) for a prototype of an electromagnetic energy mitigation assembly according to the exemplary embodiment shown in FIG. 1 using the setup/fixture shown in FIG. 4 to gauge or predict softness.

Corresponding reference numerals indicate corresponding parts throughout the several views of the drawings.

DETAILED DESCRIPTION

Example embodiments will now be described more fully with reference to the accompanying drawings.

As noted above, it is common practice to attach an electromagnetic shielding film on electronic equipment to shield interference from an external electromagnetic wave. But as recognized herein, it tends to be difficult for conventional electromagnetic shielding films to achieve good shielding effectiveness for electromagnetic waves of extremely low frequency (e.g., less than 100 kilohertz (kHZ), etc.).

For example, a conventional electromagnetic noise absorbing elastomer film having a thickness of 0.2 mm may have only a shielding effectiveness of only 3 dB against an electromagnetic wave with a frequency of 30 kHz. A conventional electromagnetic shielding film plated with alloy may provide a better shielding effect at extremely low frequency electromagnetic waves. But the alloy plating processes may limit the maximum plating thickness. And alloy plating layers with high thicknesses then to be relatively hard, which therefore reduces the softness of the electromagnetic shielding films making it difficult and inconvenient to process, use, and adhere to the electromagnetic shielding films to electronic equipment.

After recognizing the above, exemplary embodiments were developed and are disclosed herein of electromagnetic energy mitigation assemblies (e.g., multilayer electromagnet shielding films, multilayered electromagnetic shielding structures, etc.) that may help to solve the above-noted technical problems associated with poor shielding effectiveness of electromagnetic shielding films for extremely low frequency electromagnetic waves.

In exemplary embodiments, an electromagnetic energy mitigation assembly first and second electrically conductive layers (e.g., first and second copper layers, etc.). First and second permalloy layers (e.g., first and second layers of alloy including about 80% nickel and 20% iron content, etc.) along respective first and second opposite sides of the first electrically conductive layer. Third and fourth permalloy layers (e.g., third and fourth layers including about 80% nickel and 20% iron content, etc.) are along respective third and fourth opposite sides of the second electrically conductive layer. An electromagnetic noise suppression layer (e.g., a magnetically conductive metal layer, an electrically conductive metal layer, or an electromagnetic noise absorbing elastomer layer, etc.) is sandwiched between the second and third permalloy layers.

As compared to conventional electromagnetic shielding films, exemplary embodiments of the electromagnetic energy mitigation assemblies disclosed herein may advantageously be configured to have good and/or improved shielding effectiveness greater than 20 decibels (e.g., 30 decibels, etc.) at frequencies within a range from 10 kilohertz to 30 kilohertz (e.g., a shielding effectiveness of at least 38 decibels at a frequency of 30 kilohertz, a shielding effectiveness as shown in FIG. 3, etc.) and or to have good and/or reduced softness (e.g., FIG. 4, etc.).

With reference now to the figures, FIG. 1 illustrates an electromagnetic energy mitigation assembly 100 (e.g., an electromagnetic shielding film or multilayer structure, etc.) according to an exemplary embodiment. As shown, the electromagnetic energy mitigation assembly 100 includes a first electrically conductive layer 104. First and second permalloy layers 108, 112 are along (e.g., coated, plated, deposited, applied thereon without using an adhesive, etc.) respective first and second opposite sides of the first electrically conductive layer 104. The electromagnetic energy mitigation assembly 200 also includes a second electrically conductive layer 116. Third and fourth permalloy layers 120, 124 are along (e.g., coated, plated, deposited, applied thereon without using an adhesive, etc.) respective third and fourth opposite sides of the second electrically conductive layer 116. The electromagnetic energy mitigation assembly 100 further includes an electromagnetic noise suppression layer 128 sandwiched between (e.g., adhesively bonded or attached to, etc.) the second and third permalloy layers 112, 120.

The first electrically conductive layer 104 may comprise an electrically conductive metal layer, such as copper, aluminum, stainless steel, or other suitable electrically conductive layer. By way of example, the first electrically conductive layer 104 comprises a first copper foil. And the first and second permalloy layers 108, 112 comprise layers of alloy including about 80% nickel and 20% iron content that are respectively disposed along the respective first and second opposite sides of the first copper foil. The first copper foil and the first and second permalloy layers 108, 112 may have a combined thickness within a range from 2 micrometers to 60 micrometers. For example, the first copper foil and the first and second permalloy layers 108, 112 may have a combined thickness of about 20 micrometers in an exemplary embodiment. As another example, the first and second permalloy layers 108, 112 may comprise layers of permalloy 80 or highly magnetic nickel-iron-molybdenum alloy that includes about 80% nickel, 15% iron, and 5% molybdenum content. As a further example, the first and second permalloy layers 108, 112 may comprise layers of mu-metal.

The second electrically conductive layer 116 may comprise an electrically conductive metal layer, such as copper, aluminum, stainless steel, or other suitable electrically conductive layer. By way of example, the second electrically conductive layer 116 comprises a second copper foil. And the third and fourth permalloy layers 120, 124 may comprise layers of alloy including about 80% nickel and 20% iron content that are respectively disposed along the respective first and second opposite sides of the second copper foil. The second copper foil and the third and fourth permalloy layers 120, 124 may have a combined thickness within a range from 2 micrometers to 60 micrometers. For example, the second copper foil and the third and fourth permalloy layers 120, 124 may have a combined thickness of about 20 micrometers in an exemplary embodiment. As another example, the third and fourth permalloy layers 120, 124 may comprise layers of permalloy 80 or highly magnetic nickel-iron-molybdenum alloy that includes about 80% nickel, 15% iron, and 5% molybdenum content. As a further example, the third and fourth permalloy layers 120, 124 may comprise layers of mu-metal.

The electromagnetic noise suppression layer 128 may comprise a magnetically conductive metal layer, an electrically conductive metal layer, an electromagnetic noise absorbing elastomer layer, other electromagnetic wave absorbing material sandwiched between (e.g., adhesively bonded or attached to, etc.) the second and third permalloy layers 112, 120. By way of example, the electromagnetic noise suppression layer 128 may comprise an electromagnetic noise absorbing elastomer layer (e.g., magnetic powder within resin, etc.) having one or more of the properties shown in Table 1 below. The electromagnetic noise suppression layer 128 may have a thickness within a range from 0.03 millimeters to 1 millimeter. For example, the electromagnetic noise suppression layer 128 may have a thickness of about 0.2 millimeters.

TABLE 1

| Initial permeability @ 1 MHZ | 110 |
|---|---|
| Effective frequency range | 20 MHZ-2 GHz |
| Specific gravity (g/cc) | 3.5 |
| Thickness (mm) | 0.06, 0.10, 0.20, 0.40 |
| Thickness tolerance | +/−10% |
| Operating temperature range (° C.) | −40 up to 105 |
| Surface resistivity (Ω) | $10^6$ min. |
| Thermal conductivity (W/mK) | 1.0 |
| Tensile strength (Mpa) | 35 |
| Outgassing (% TML) (% CVCM)* | 0.186/0.011 |

With continued reference to FIG. 1, the first permalloy layer 108 defines an outermost top surface of the electromagnetic energy mitigation assembly 100. The fourth permalloy layer 124 defines an outermost bottom surface of the electromagnetic energy mitigation assembly 100. The electromagnetic energy mitigation assembly 100 may comprise a multilayer electromagnetic shielding sheet or film.

In exemplary embodiments, an automotive vehicle component comprises the electromagnetic energy mitigation assembly 100. The electromagnetic energy mitigation assembly 100 is configured to define or be positionable along a surface above one or more batteries of an automotive vehicle whereat the electromagnetic energy mitigation assembly is operable for providing electromagnetic shielding for the one or more batteries. In an exemplary embodiment, the electromagnetic energy mitigation assembly 100 may be positionable within the automotive vehicle to define a thermally-conductive heat transfer path for thermal management, e.g., for the one or more batteries, etc.

In exemplary embodiments, an automotive vehicle comprises the electromagnetic energy mitigation assembly 100. And the electromagnetic energy mitigation assembly 100 is positioned relative to one or more batteries of the automotive vehicle such that the electromagnetic energy mitigation assembly is operable for providing electromagnetic shielding for the one or more batteries. In an exemplary embodiment, the electromagnetic energy mitigation assembly 100 is positioned within the automotive vehicle to define a thermally-conductive heat transfer path for thermal management, e.g., for the one or more batteries, etc.

FIG. 3 includes a line graph of shielding effectiveness in decibels (dB) versus frequency in hertz (Hz) for a prototype of the electromagnetic energy mitigation assembly 100 according to the exemplary embodiment shown in FIG. 1 where the shielding effectiveness testing included using magnetic loop antennas. FIG. 4 includes a line graph of force in Newtons (N) versus deflection in millimeters (mm) for a prototype of an electromagnetic energy mitigation assembly according to the exemplary embodiment shown in FIG. 1 using the setup/fixture shown in FIG. 4 to gauge or predict softness. For this deflection/softness testing, the less force required to deflect a first sample to a same thickness as a second sample indicates that the first sample is softer than the second sample.

For the shielding effectiveness testing shown in FIG. 3 and the deflection/softness testing shown in FIG. 4, the prototype of the electromagnetic energy mitigation assembly 100 included the following. The first electrically conductive layer 104 comprised a first copper foil. The first and second permalloy layers 108, 112 comprised layers of alloy including about 80% nickel and 20% iron content respectively disposed along the respective first and second opposite sides of the first copper foil. The first copper foil and the first and second permalloy layers 108, 112 had a combined thickness of about 20 micrometers. The second electrically conductive layer 116 comprised a second copper foil. The third and fourth permalloy layers 120, 124 comprised layers of alloy including about 80% nickel and 20% iron content respectively disposed along the respective first and second opposite sides of the second copper foil. The second copper foil and the third and fourth permalloy layers 120, 124 had a combined thickness of about 20 micrometers in an exemplary embodiment. The electromagnetic noise suppression layer 128 comprised an electromagnetic noise absorbing elastomer layer having the properties shown in Table 1 above. The electromagnetic noise suppression layer 128 had a thickness of about 0.2 millimeters.

As shown by FIG. 3, the prototype of the electromagnetic energy mitigation assembly 100 had a shielding effectiveness greater than 20 decibels at frequencies within a range from 10 kilohertz to 30 kilohertz. For example, the prototype of the electromagnetic energy mitigation assembly 100 had a shielding effectiveness of at least 38 decibels at a frequency of 30 kilohertz.

As shown by FIG. 4, the prototype of the electromagnetic energy mitigation assembly 100 was also relatively soft. For example, the prototype of the electromagnetic energy mitigation assembly 100 having a length of 70 millimeters and width of 1 millimeter deflected at least 8 millimeters at a force less than 2 Newtons.

Figure 2:
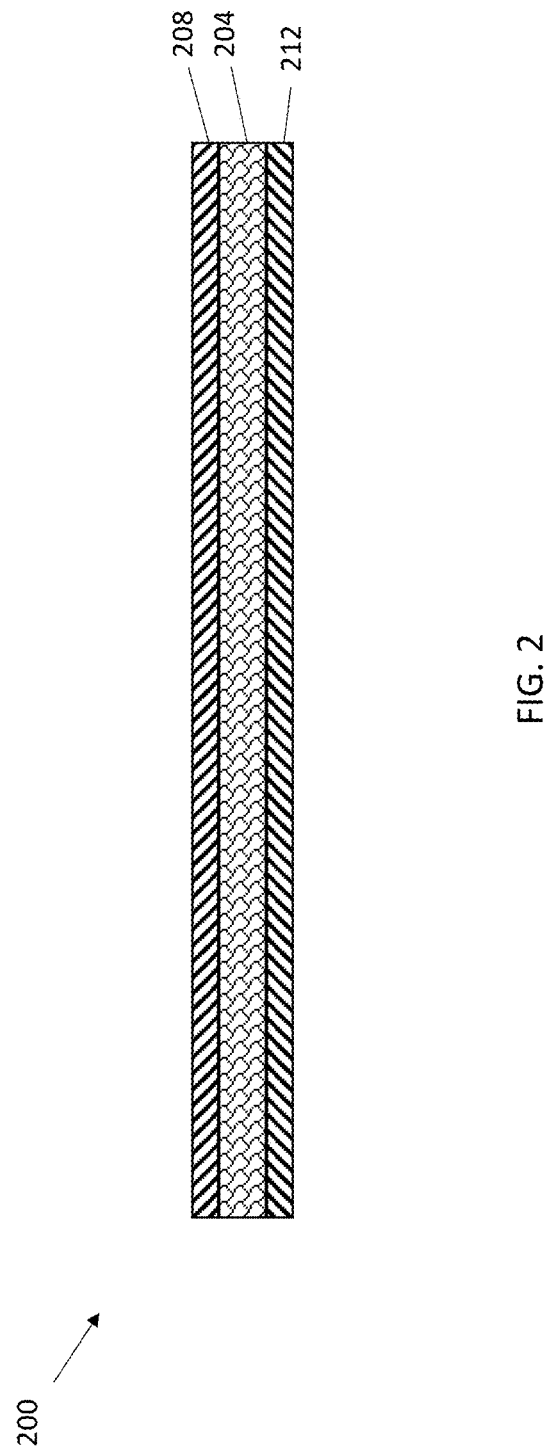
FIG. 2 is a cross-sectional view of an electromagnetic energy mitigation assembly according to another exemplary embodiment.

FIG. 2 illustrates another electromagnetic energy mitigation assembly 200 (e.g., an electromagnetic shielding film or multilayer structure, etc.) according to another exemplary embodiment. As shown, the electromagnetic energy mitigation assembly 200 includes an electrically conductive layer 204. First and second permalloy layers 208, 212 are along (e.g., coated, plated, deposited, applied thereon without using an adhesive, etc.) respective first and second opposite sides of the electrically conductive layer 204.

The electrically conductive layer 204 may comprise an electrically conductive metal layer, such as copper, aluminum, stainless steel, or other suitable electrically conductive layer. By way of example, the electrically conductive layer 204 comprises a copper foil. And the first and second permalloy layers 208, 212 comprise alloy layers including about 80% nickel and 20% iron content that are respectively disposed along the respective first and second opposite sides of the copper foil. The copper foil and the first and second permalloy layers 208, 212 may have a combined thickness within a range from 2 micrometers to 60 micrometers. For example, the copper foil and the first and second permalloy layers 208, 212 may have a combined thickness of about 20 micrometers in an exemplary embodiment. As another example, the first and second permalloy layers 208, 212 may comprise layers of permalloy 80 or highly magnetic nickel-iron-molybdenum alloy that includes about 80% nickel, 15% iron, and 5% molybdenum content. As a further example, the first and second permalloy layers 208, 212 may comprise layers of mu-metal.

With continued reference to FIG. 2, the first permalloy layer 208 defines an outermost top surface of the electromagnetic energy mitigation assembly 200. The second permalloy layer 212 defines an outermost bottom surface of the electromagnetic energy mitigation assembly 200. The electromagnetic energy mitigation assembly 200 may comprise a multilayer electromagnetic shielding sheet or film.

In exemplary embodiments, an automotive vehicle component comprises the electromagnetic energy mitigation assembly 200. The electromagnetic energy mitigation assembly 200 is configured to define or be positionable along a surface above one or more batteries of an automotive vehicle whereat the electromagnetic energy mitigation assembly is operable for providing electromagnetic shielding for the one or more batteries. In an exemplary embodiment, the electromagnetic energy mitigation assembly 200 may be positionable within the automotive vehicle to define a thermally-conductive heat transfer path for thermal management, e.g., for the one or more batteries, etc.

In exemplary embodiments, an automotive vehicle comprises the electromagnetic energy mitigation assembly 200. And the electromagnetic energy mitigation assembly 200 is positioned relative to one or more batteries of the automotive vehicle such that the electromagnetic energy mitigation assembly is operable for providing electromagnetic shielding for the one or more batteries. In an exemplary embodiment, the electromagnetic energy mitigation assembly 200 is positioned within the automotive vehicle to define a thermally-conductive heat transfer path for thermal management, e.g., for the one or more batteries, etc.

Accordingly, exemplary embodiments are disclosed of electromagnetic energy mitigation assemblies. In an exemplary embodiment, an electromagnetic energy mitigation assembly includes a first electrically conductive layer and a second electrically conductive layer. First and second permalloy layers are along respective first and second opposite sides of the first electrically conductive layer. Third and fourth permalloy layers are along respective third and fourth opposite sides of the second electrically conductive layer. An electromagnetic noise suppression layer is sandwiched between the second and third permalloy layers.

In exemplary embodiments, the first and second electrically conductive layers comprise first and second copper layers, respectively. And the electromagnetic noise suppression layer comprises a magnetically conductive metal layer, an electrically conductive metal layer, or an electromagnetic noise absorbing elastomer layer.

In exemplary embodiments, the electromagnetic noise suppression layer comprises an electromagnetic noise absorbing elastomer layer.

In exemplary embodiments, the first and fourth permalloy layers define outermost surfaces of the electromagnetic energy mitigation assembly.

In exemplary embodiments, the first electrically conductive layer and the first and second permalloy layers have a combined thickness within a range from 2 micrometers to 60 micrometers. The second electrically conductive layer and the third and fourth permalloy layers have a combined thickness within a range from 2 micrometers to 60 micrometers. And the electromagnetic noise suppression layer has a thickness within a range from 0.03 millimeters to 1 millimeter.

In exemplary embodiments, the first electrically conductive layer and the first and second permalloy layers have a combined thickness of 20 micrometers. The second electrically conductive layer and the third and fourth permalloy layers have a combined thickness of 20 micrometers. And the electromagnetic noise suppression layer has a thickness of 0.2 millimeters.

In exemplary embodiments, the electromagnetic energy mitigation assembly is configured to have a shielding effectiveness greater than 20 decibels at frequencies within a range from 10 kilohertz to 30 kilohertz. For example, the electromagnetic energy mitigation assembly may be configured to have a shielding effectiveness of at least 38 decibels at a frequency of 30 kilohertz.

In exemplary embodiments, the first and second permalloy layers comprise first and second permalloy coatings along the respective first and second opposite sides of the first electrically conductive layer. And the third and fourth permalloy layers comprise third and fourth permalloy coatings along the respective third and fourth opposite sides of the second electrically conductive layer.

In exemplary embodiments, the first and second permalloy layers comprise first and second permalloy platings along the respective first and second opposite sides of the first electrically conductive layer. And the third and fourth permalloy layers comprise third and fourth permalloy platings along the respective third and fourth opposite sides of the second electrically conductive layer.

In exemplary embodiments, the first and second permalloy layers comprise first and second nickel-iron magnetic alloy deposits along the respective first and second opposite sides of the first electrically conductive layer. And the third and fourth permalloy layers comprise third and fourth nickel-iron magnetic alloy deposits along the respective third and fourth opposite sides of the second electrically conductive layer.

In exemplary embodiments, the electromagnetic energy mitigation assembly consists of only: the first and second permalloy layers along the respective first and second opposite sides of the first electrically conductive layer; the third and fourth permalloy layers along the respective third and fourth opposite sides of the second electrically conductive layer; and the electromagnetic noise suppression layer adhesively bonded between the second and third permalloy layers.

In exemplary embodiments, the electromagnetic energy mitigation assembly consists of only: a first multilayer structure defined by or including the first and second permalloy layers along the respective first and second opposite sides of the first electrically conductive layer; a second multilayer structure defined by or including the third and fourth permalloy layers along the respective third and fourth opposite sides of the second electrically conductive layer; and the electromagnetic noise suppression layer adhesively bonded between the first multilayer structure and the second multilayer structure, the electromagnetic noise suppression layer softer than the first multilayer structure and the second multilayer structure.

In exemplary embodiments, the first electrically conductive layer comprises a first copper foil. The first and second permalloy layers are disposed along respective first and second opposite sides of the first copper foil such that the first copper foil and the first and second permalloy layers have a combined thickness within a range from 2 micrometers to 60 micrometers. The second electrically conductive layer comprises a second copper foil. The third and fourth permalloy layers are disposed along respective third and fourth opposite sides of the second copper foil such that the second copper foil and the third and fourth permalloy layers have a combined thickness within a range from 2 micrometers to 60 micrometers. The electromagnetic noise suppression layer comprises an electromagnetic noise absorbing elastomer layer having a thickness from 0.03 millimeters to 1 millimeter. And the electromagnetic energy mitigation assembly is configured to have a shielding effectiveness greater than 20 decibels at frequencies within a range from 10 kilohertz to 30 kilohertz.

In exemplary embodiments, the electromagnetic energy mitigation assembly is a multilayer electromagnetic shielding sheet or film.

In exemplary embodiments, an automotive vehicle component comprises an electromagnetic energy mitigation assembly as disclosed herein. The electromagnetic energy mitigation assembly is configured to define or be positionable along a surface above one or more batteries of an automotive vehicle whereat the electromagnetic energy mitigation assembly is operable for providing electromagnetic shielding for the one or more batteries.

In exemplary embodiments, an automotive vehicle comprises an electromagnetic energy mitigation assembly as disclosed herein. The electromagnetic energy mitigation assembly is positioned relative to one or more batteries of the automotive vehicle such that the electromagnetic energy mitigation assembly is operable for providing electromagnetic shielding for the one or more batteries.

Also disclosed are exemplary embodiments of automotive vehicle components including electromagnetic energy mitigation assemblies. In an exemplary embodiment, an automotive vehicle component includes an electromagnetic energy mitigation assembly configured to be positioned relative to one or more batteries of an automotive vehicle for providing electromagnetic shielding for the one or more batteries. The electromagnetic energy mitigation assembly includes a first electrically conductive layer. First and second permalloy layers are along respective first and second opposite sides of the first electrically conductive layer.

In exemplary embodiments of the automotive vehicle component, the electromagnetic energy mitigation assembly further comprises: a second electrically conductive layer; third and fourth permalloy layers along respective third and fourth opposite sides of the second electrically conductive layer; and an electromagnetic noise suppression layer sandwiched between the second and third permalloy layers. The first and second electrically conductive layers may comprise first and second copper layers, respectively. And the electromagnetic noise suppression layer may comprises a magnetically conductive metal layer, an electrically conductive metal layer, or an electromagnetic noise absorbing elastomer layer.

In exemplary embodiments of the automotive vehicle component, the electromagnetic energy mitigation assembly comprises an electromagnetic noise absorbing elastomer layer.

In exemplary embodiments of the automotive vehicle component, the electromagnetic energy mitigation assembly the first and second permalloy layers respectively define outermost surfaces of the electromagnetic energy mitigation assembly.

In exemplary embodiments of the automotive vehicle component, the first electrically conductive layer comprises a first copper foil. And the first and second permalloy layers are disposed along respective first and second opposite sides of the first copper foil such that the first copper foil and the first and second permalloy layers have a combined thickness within a range from 2 micrometers to 60 micrometers.

In exemplary embodiments of the automotive vehicle component, the electromagnetic energy mitigation assembly is a multilayer electromagnetic shielding sheet or film.

In exemplary embodiments, an automotive vehicle comprises an automotive vehicle component including an electromagnetic energy mitigation assembly as disclosed herein. The electromagnetic energy mitigation assembly is positioned relative to one or more batteries of the automotive vehicle such that the electromagnetic energy mitigation assembly is operable for providing electromagnetic shielding for the one or more batteries.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific numerical dimensions and values, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (the disclosure of a first value and a second value for a given parameter may be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping, or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected, or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section could be termed a second element, component, region, layer, or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and may be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An electromagnetic energy mitigation assembly wherein the electromagnetic energy mitigation assembly comprises:
   a first electrically conductive layer;
   first and second permalloy layers along respective first and second opposite sides of the first electrically conductive layer;
   a second electrically conductive layer;
   third and fourth permalloy layers along respective third and fourth opposite sides of the second electrically conductive layer; and
   an electromagnetic noise suppression layer sandwiched between the second and third permalloy layers.

2. The electromagnetic energy mitigation assembly of claim 1, wherein:
   the first and second electrically conductive layers comprise first and second copper layers, respectively; and
   the electromagnetic noise suppression layer comprises a magnetically conductive metal layer, an electrically conductive metal layer, or an electromagnetic noise absorbing elastomer layer.

3. The electromagnetic energy mitigation assembly of claim 1, wherein the electromagnetic noise suppression layer comprises an electromagnetic noise absorbing elastomer layer.

4. The electromagnetic energy mitigation assembly of claim 1, wherein the first and fourth permalloy layers define outermost surfaces of the electromagnetic energy mitigation assembly.

5. The electromagnetic energy mitigation assembly of claim 1, wherein:
   the first electrically conductive layer and the first and second permalloy layers have a combined thickness within a range from 2 micrometers to 60 micrometers;
   the second electrically conductive layer and the third and fourth permalloy layers have a combined thickness within a range from 2 micrometers to 60 micrometers; and
   the electromagnetic noise suppression layer has a thickness within a range from 0.03 millimeters to 1 millimeter.

6. The electromagnetic energy mitigation assembly of claim 1, wherein:
   the first electrically conductive layer and the first and second permalloy layers have a combined thickness of 20 micrometers;
   the second electrically conductive layer and the third and fourth permalloy layers have a combined thickness of 20 micrometers; and
   the electromagnetic noise suppression layer has a thickness of 0.2 millimeters.

7. The electromagnetic energy mitigation assembly of claim 1, wherein the electromagnetic energy mitigation assembly is configured to have a shielding effectiveness greater than 20 decibels at frequencies within a range from 10 kilohertz to 30 kilohertz.

8. The electromagnetic energy mitigation assembly of claim 1, wherein the electromagnetic energy mitigation assembly is configured to have a shielding effectiveness of at least 38 decibels at a frequency of 30 kilohertz.

9. The electromagnetic energy mitigation assembly of claim 1, wherein:
   the first and second permalloy layers comprise first and second permalloy coatings along the respective first and second opposite sides of the first electrically conductive layer; and
   the third and fourth permalloy layers comprise third and fourth permalloy coatings along the respective third and fourth opposite sides of the second electrically conductive layer.

10. The electromagnetic energy mitigation assembly of claim 1, wherein:
    the first and second permalloy layers comprise first and second permalloy platings along the respective first and second opposite sides of the first electrically conductive layer; and
    the third and fourth permalloy layers comprise third and fourth permalloy platings along the respective third and fourth opposite sides of the second electrically conductive layer.

11. The electromagnetic energy mitigation assembly of claim 1, wherein:
    the first and second permalloy layers comprise first and second nickel-iron magnetic alloy deposits along the respective first and second opposite sides of the first electrically conductive layer; and
    the third and fourth permalloy layers comprise third and fourth nickel-iron magnetic alloy deposits along the respective third and fourth opposite sides of the second electrically conductive layer.

12. The electromagnetic energy mitigation assembly of claim 1, wherein the electromagnetic energy mitigation assembly consists of only:
    the first and second permalloy layers along the respective first and second opposite sides of the first electrically conductive layer;
    the third and fourth permalloy layers along the respective third and fourth opposite sides of the second electrically conductive layer; and
    the electromagnetic noise suppression layer adhesively bonded between the second and third permalloy layers.

13. The electromagnetic energy mitigation assembly of claim 1, wherein the electromagnetic energy mitigation assembly consists of only:
    a first multilayer structure defined by or including the first and second permalloy layers along the respective first and second opposite sides of the first electrically conductive layer;
    a second multilayer structure defined by or including the third and fourth permalloy layers along the respective third and fourth opposite sides of the second electrically conductive layer; and
    the electromagnetic noise suppression layer adhesively bonded between the first multilayer structure and the second multilayer structure, the electromagnetic noise suppression layer softer than the first multilayer structure and the second multilayer structure.

14. The electromagnetic energy mitigation assembly of claim 1, wherein:
- the first electrically conductive layer comprises a first copper foil;
- the first and second permalloy layers are disposed along respective first and second opposite sides of the first copper foil such that the first copper foil and the first and second permalloy layers have a combined thickness within a range from 2 micrometers to 60 micrometers;
- the second electrically conductive layer comprises a second copper foil;
- the third and fourth permalloy layers are disposed along respective third and fourth opposite sides of the second copper foil such that the second copper foil and the third and fourth permalloy layers have a combined thickness within a range from 2 micrometers to 60 micrometers;
- the electromagnetic noise suppression layer comprises an electromagnetic noise absorbing elastomer layer having a thickness from 0.03 millimeters to 1 millimeter; and
- the electromagnetic energy mitigation assembly is configured to have a shielding effectiveness greater than 20 decibels at frequencies within a range from 10 kilohertz to 30 kilohertz.

15. The electromagnetic energy mitigation assembly of claim 1, wherein the electromagnetic energy mitigation assembly is a multilayer electromagnetic shielding sheet or film.

16. An automotive vehicle component comprising the electromagnetic energy mitigation assembly of claim 1, wherein the electromagnetic energy mitigation assembly is configured to define or be positionable along a surface above one or more batteries of an automotive vehicle whereat the electromagnetic energy mitigation assembly is operable for providing electromagnetic shielding for the one or more batteries.

17. An automotive vehicle component comprising the electromagnetic energy mitigation assembly of claim 1.

18. An automotive vehicle component wherein the automotive vehicle component comprises an electromagnetic energy mitigation assembly configured to be positioned relative to one or more batteries of an automotive vehicle for providing electromagnetic shielding for the one or more batteries, the electromagnetic energy mitigation assembly comprising:
- a first electrically conductive layer;
- first and second permalloy layers along respective first and second opposite sides of the first electrically conductive layer;
- a second electrically conductive layer;
- third and fourth permalloy layers along respective third and fourth opposite sides of the second electrically conductive layer; and
- an electromagnetic noise suppression layer sandwiched between the second and third permalloy layers.

19. The automotive vehicle component of claim 18, wherein:
- the first and second electrically conductive layers comprise first and second copper layers, respectively; and
- the electromagnetic noise suppression layer comprises a magnetically conductive metal layer, an electrically conductive metal layer, or an electromagnetic noise absorbing elastomer layer.

20. The automotive vehicle component of claim 18, wherein the electromagnetic noise suppression layer comprises an electromagnetic noise absorbing elastomer layer.

21. The automotive vehicle component of claim 18, wherein the first and fourth permalloy layers respectively define outermost surfaces of the electromagnetic energy mitigation assembly.

22. The automotive vehicle component of claim 18, wherein:
- the first electrically conductive layer comprises a first copper foil; and
- the first and second permalloy layers are disposed along respective first and second opposite sides of the first copper foil such that the first copper foil and the first and second permalloy layers have a combined thickness within a range from 2 micrometers to 60 micrometers.

23. The automotive vehicle component of claim 18, wherein the electromagnetic energy mitigation assembly is a multilayer electromagnetic shielding sheet or film.

* * * * *